(12) United States Patent
Park et al.

(10) Patent No.: US 10,177,207 B2
(45) Date of Patent: Jan. 8, 2019

(54) ORGANIC LIGHT EMITTING DIODE DISPLAY AND MANUFACTURING METHOD THEREOF

(71) Applicant: Samsung Display Co., Ltd, Yongin-si, Gyeonggi-do (KR)

(72) Inventors: Jae-Hyun Park, Yongin-si (KR); Jun Hyuck Jeon, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/371,056

(22) Filed: Dec. 6, 2016

(65) Prior Publication Data

US 2017/0200776 A1 Jul. 13, 2017

(30) Foreign Application Priority Data

Jan. 13, 2016 (KR) .......................... 10-2016-0004202

(51) Int. Cl.
| | |
|---|---|
| *H01L 27/32* | (2006.01) |
| *H01L 51/52* | (2006.01) |
| *H01L 51/50* | (2006.01) |
| *H01L 51/56* | (2006.01) |

(52) U.S. Cl.
CPC ...... *H01L 27/3248* (2013.01); *H01L 27/3246* (2013.01); *H01L 51/5012* (2013.01); *H01L 51/5206* (2013.01); *H01L 51/5221* (2013.01); *H01L 51/5278* (2013.01); *H01L 51/56* (2013.01); *H01L 2227/323* (2013.01); *H01L 2251/303* (2013.01)

(58) Field of Classification Search
CPC ............ H01L 27/3246; H01L 27/3248; H01L 51/5012; H01L 51/5206; H01L 51/5221; H01L 51/5278
See application file for complete search history.

(56) References Cited

U.S. PATENT DOCUMENTS

| | | | |
|---|---|---|---|
| 8,404,509 B2 | 3/2013 | Park | |
| 2013/0056784 A1* | 3/2013 | Lee | ...................... H01L 27/3246 257/99 |
| 2014/0312323 A1* | 10/2014 | Park | ...................... H01L 51/525 257/40 |
| 2015/0076451 A1* | 3/2015 | Dobbertin | ............. H01L 51/504 257/40 |

(Continued)

FOREIGN PATENT DOCUMENTS

| | | |
|---|---|---|
| JP | 4016144 B2 | 9/2009 |
| KR | 10-1463030 B1 | 11/2014 |
| KR | 10-2015-0044083 A | 4/2015 |

*Primary Examiner* — Allan R Wilson
(74) *Attorney, Agent, or Firm* — Innovation Counsel LLP

(57) ABSTRACT

An organic light emitting diode display according to an exemplary embodiment of the present disclosure includes: a substrate; a first electrode disposed on the substrate; an auxiliary electrode formed at the same layer as the first electrode; a pixel defining layer having a first contact hole overlapping a part of the auxiliary electrode; an organic light emitting member disposed on the pixel defining layer and having a second contact hole enclosing the first contact hole; and a second electrode disposed on the organic light emitting member and inside the first contact hole and the second contact hole, wherein the second electrode is in contact with the auxiliary electrode through the first contact hole and the second contact hole.

3 Claims, 12 Drawing Sheets

(56) References Cited

U.S. PATENT DOCUMENTS

| | | | |
|---|---|---|---|
| 2015/0102294 A1* | 4/2015 | Choi | H01L 51/5203 257/40 |
| 2016/0172634 A1* | 6/2016 | Kim | H01L 51/5228 257/40 |
| 2017/0186831 A1* | 6/2017 | Nam | H01L 27/3272 |

* cited by examiner

ORGANIC LIGHT EMITTING DIODE DISPLAY AND MANUFACTURING METHOD THEREOF

CROSS-REFERENCE TO RELATED APPLICATION

This application claims priority to and the benefit of Korean Patent Application No. 10-2016-0004202 filed in the Korean Intellectual Property Office on Jan. 13, 2016, the entire contents of which are incorporated herein by reference.

BACKGROUND

1. Field

The present disclosure relates to an organic light emitting diode display and a manufacturing method thereof.

2. Description of the Related Art

An organic light emitting diode display includes two electrodes and an organic light emitting layer positioned therebetween. Electrons injected from a cathode which is an electrode and holes injected from an anode which is another electrode are bonded to each other in the organic light emitting layer to form excitons. Light is emitted while the excitons discharge energy.

The organic light emitting diode display includes a plurality of pixels including an organic light emitting diode made of a cathode, an anode, and an organic emission layer, and each pixel includes a plurality of transistors and a capacitor to drive the organic light emitting diode.

As the organic light emitting diode display is large, a screen smudge is generated by a voltage drop of the cathode. To prevent the screen smudge, the voltage drop of the cathode is minimized by positioning an auxiliary electrode in a display area and connecting the auxiliary electrode to the cathode.

The above information disclosed in this Background section is only for enhancement of understanding of the background of the disclosure and therefore it may contain information that does not form the prior art that is already known in this country to a person of ordinary skill in the art.

SUMMARY

An exemplary embodiment of the present disclosure relates to an organic light emitting diode display minimizing a voltage drop of an electrode transmitted with a common voltage, and a manufacturing method thereof.

An organic light emitting diode display according to an exemplary embodiment of the present disclosure includes: a substrate; a first electrode disposed on the substrate; an auxiliary electrode formed at the same layer as the first electrode; a pixel defining layer having a first contact hole overlapping a part of the auxiliary electrode; an organic light emitting member disposed on the pixel defining layer and having a second contact hole enclosing the first contact hole; and a second electrode disposed on the organic light emitting member and inside the first contact hole and the second contact hole, wherein the second electrode is in contact with the auxiliary electrode through the first contact hole and the second contact hole.

A width of the second contact hole may be larger than a width of the first contact hole.

The organic light emitting member may include an organic emission layer.

The organic light emitting member may include a plurality of first organic emission layers, and at least one middle layer disposed on the first organic emission layers, and each of the plurality of first organic emission layer and the at least one middle layer may be alternately deposited.

The organic light emitting member may further include a second organic emission layer covering the middle layer.

The second organic emission layer may cover a side wall of the middle layer.

The middle layer may include a metal oxide to facilitate charge generation.

A manufacturing method according to an organic light emitting diode display according to an exemplary embodiment of the present disclosure includes: forming a first electrode and an auxiliary electrode on a substrate, the auxiliary electrode being separated from the first electrode; forming a pixel defining layer covering the first electrode and the auxiliary electrode and having a first contact hole overlapping a part of the auxiliary electrode; forming a first photosensitive film overlapping the first contact hole of the pixel defining layer; forming an organic light emitting member on the pixel defining layer and the first photosensitive film; removing the first photosensitive film to form a second contact hole in the organic light emitting member; and forming a second electrode in contact with the auxiliary electrode through the first contact hole and the second contact hole.

The first photosensitive film may cover the first contact hole.

A width of the second contact hole is larger than a width of the first contact hole.

The forming an organic light emitting member may further include forming an organic emission layer Also, a manufacturing method for an organic light emitting diode display according to another exemplary embodiment of the present disclosure includes: forming a first electrode and an auxiliary electrode separated from the first electrode; forming a pixel defining layer covering the first electrode and the auxiliary electrode and having a first contact hole overlapping a part of the auxiliary electrode; forming a first photosensitive film overlapping the first contact hole of the pixel defining layer; depositing a first organic emission layer and a middle layer on the pixel defining layer and the first photosensitive film; removing the first photosensitive film to form a temporary contact hole in the first organic emission layer and the middle layer; forming a second photosensitive film inside the temporary contact hole; forming a second organic emission layer on the middle layer and the second photosensitive film; removing the second photosensitive film to form a second contact hole in an organic light emitting member including the first organic emission layer, the middle layer, and the second organic emission layer; and forming a second electrode in contact with the auxiliary electrode through the first contact hole and the second contact hole.

A width of the second photosensitive film may be smaller than a width of the first photosensitive film.

The forming a second organic emission layer may further comprise forming the second organic emission layer so as to cover a side wall of the middle layer.

The method may further include repeating the depositing a first organic emission layer and a middle layer.

According to an exemplary embodiment of the present disclosure, even if a laser drilling process is not performed, the second electrode and the auxiliary electrode are in electrical contact such that damage to a pixel by a laser is not generated.

Also, since the laser drilling process is not performed, particles are not generated such that a bright point or a dark point may be minimized such that a yield may be improved.

Furthermore, to electrically contact the second electrode and the auxiliary electrode, the laser drilling process is not performed, but the photolithography process may be used such that separate laser drilling equipment is not needed, thereby reducing a manufacturing cost.

In addition, to contact the second electrode and the auxiliary electrode, when the laser drilling process forms a plurality of openings in the organic light emitting member, the manufacturing time is increased; however, according to the present disclosure, although the plurality of openings are formed, the manufacturing time may be maintained to be equal to that of the conventional art.

Also, in the laser drilling process, it is difficult to control a diameter of a laser spot such that a process error is large, and accordingly, the width of the auxiliary electrode must be increased, thereby an aperture ratio is reduced and it is difficult to be applied for high resolution. However, according to the present disclosure, the opening may be easily formed by the photolithography process such that the process error is small, and accordingly the width of the auxiliary electrode may be minimized, thereby an increased aperture ratio and high resolution may be realized.

DETAILED DESCRIPTION OF THE EMBODIMENTS

Figure 1:
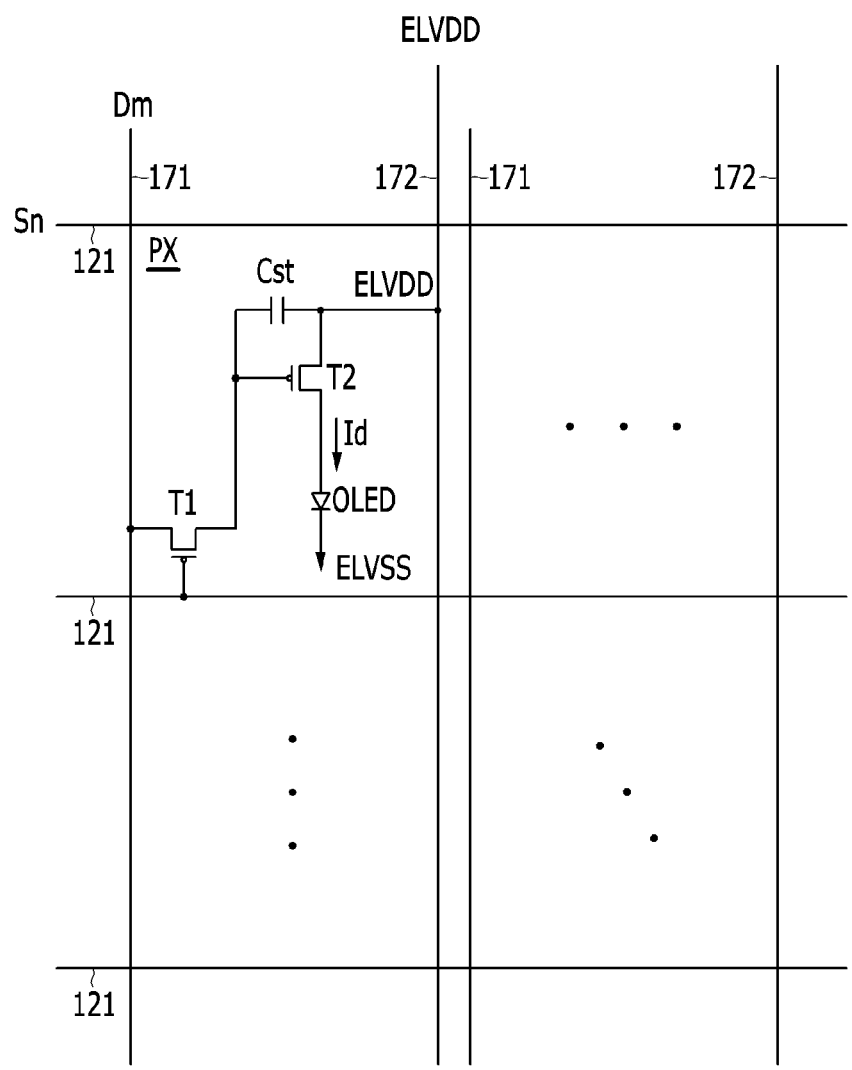
FIG. 1 is an equivalent circuit diagram of an organic light emitting diode display according to an exemplary embodiment of the present disclosure.

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

In order to clarify the present disclosure, parts that are not connected with the description will be omitted, and the same elements or equivalents are referred to by the same reference numerals throughout the specification.

In addition, the size and thickness of each configuration shown in the drawings are arbitrarily shown for understanding and ease of description, but the present disclosure is not limited thereto. In the drawings, the thickness of layers, films, panels, regions, etc., are exaggerated for clarity. In the drawings, for understanding and ease of description, the thickness of some layers and areas is exaggerated.

In addition, unless explicitly described to the contrary, the word "comprise" and variations such as "comprises" or "comprising" will be understood to imply the inclusion of stated elements but not the exclusion of any other elements. It will be understood that when an element such as a layer, film, region, or substrate is referred to as being "on" another element, it can be directly on the other element or intervening elements may also be present. Further, in the specification, the word "~on" or "~over" means positioning on or below the object portion, but does not essentially mean positioning on the upper side of the object portion based on a gravity direction.

In addition, in the specification, the phrase "on a plane" means viewing the object portion from the top, and the phrase "on a cross-section" means viewing a cross-section of which the object portion is vertically cut from the side.

Also, the present disclosure is not limited to a number of transistors and capacitors shown in accompanying drawings, and in the organic light emitting diode display, each pixel may be provided with a plurality of transistors and at least one capacitor, and may be formed to have various structures by further forming additional wires or omitting existing wires. In this case, the pixel is a minimum unit for displaying an image, and the organic light emitting diode display displays the image through the plurality of pixels.

Now, an organic light emitting diode display according to an exemplary embodiment of the present disclosure will be described with reference to accompanying drawings.

FIG. 1 is an equivalent circuit diagram of an organic light emitting diode display according to an exemplary embodiment of the present disclosure.

As shown in FIG. 1, the organic light emitting diode display according to an exemplary embodiment of the present disclosure includes a plurality of signal lines 121, 171, and 172, and a plurality of pixels PX connected to the plurality of signal lines 121, 171, and 172 and arranged substantially in a matrix.

The signal lines 121, 171, and 172 include a plurality of scan lines 121 transmitting a scan signal Sn, a plurality of data lines 171 crossing the scan lines 121 and transmitting a data signal Dm, and a plurality of driving voltage lines 172 transmitting a driving voltage ELVDD. The scan lines 121 are substantially extended in a row direction and almost parallel with each other, and the data lines 171 and the driving voltage lines 172 are substantially extended in a column direction and almost parallel with each other.

Each pixel PX includes a plurality of transistors T1 and T2 respectively connected to the plurality of signal lines 121, 171, and 172, a storage capacitor Cst, and an organic light emitting diode (OLED).

The transistors T1 and T2 include a switching transistor T1 connected to the data line 171, and a driving transistor T2 connected to the organic light emitting diode OLED. The switching transistor T1 includes a control terminal, an input terminal, and an output terminal, and the control terminal thereof is connected to the scan line 121, the input terminal thereof is connected to the data line 171, and the output terminal thereof is connected to the driving transistor T2. The switching transistor T1 transmits the data signal Dm applied to the data line 171 to the driving transistor T2 in response to the scan signal Sn applied to the scan line 121.

The driving transistor T2 also includes a control terminal, an input terminal, and an output terminal, and the control terminal thereof is connected to the switching transistor T1, the input terminal thereof is connected to the driving voltage line 172, and the output terminal thereof is connected to the organic light emitting diode OLED. The driving transistor T2 allows a driving current Id, which has a level that varies according to a voltage applied between the control terminal and the output terminal, to flow.

The storage capacitor Cst is connected between the control terminal and the input terminal of the driving transistor T2. The storage capacitor Cst charges a data signal applied to the control terminal of the driving transistor T2, and maintains charging of the data signal after the switching transistor T1 is turned off.

The organic light emitting diode OLED includes an anode connected to the output terminal of the driving transistor T2, a cathode connected to a common voltage ELVSS, and an organic light emitting member formed between the anode and the cathode. The organic light emitting diode OLED displays an image by emitting light with different intensity according to the output current Id of the driving transistor T2.

The switching transistor T1 and the driving transistor T2 may be n-channel field effect transistors (FETs) or p-channel FETs. In addition, a connection relationship between the transistors T1 and T2, the storage capacitor Cst, and the organic light emitting diode OLED can be changed.

Furthermore, in the exemplary embodiment of the present disclosure, the structure having two transistors and one capacitor is illustrated, but the present disclosure is not limited thereto, and the number of transistors and the number of capacitors may be variously modified.

Hereinafter, a detailed operation process of one pixel of the organic light emitting diode display shown in FIG. 1 will be described in detail with reference to FIG. 2 and FIG. 3.

Figure 2:
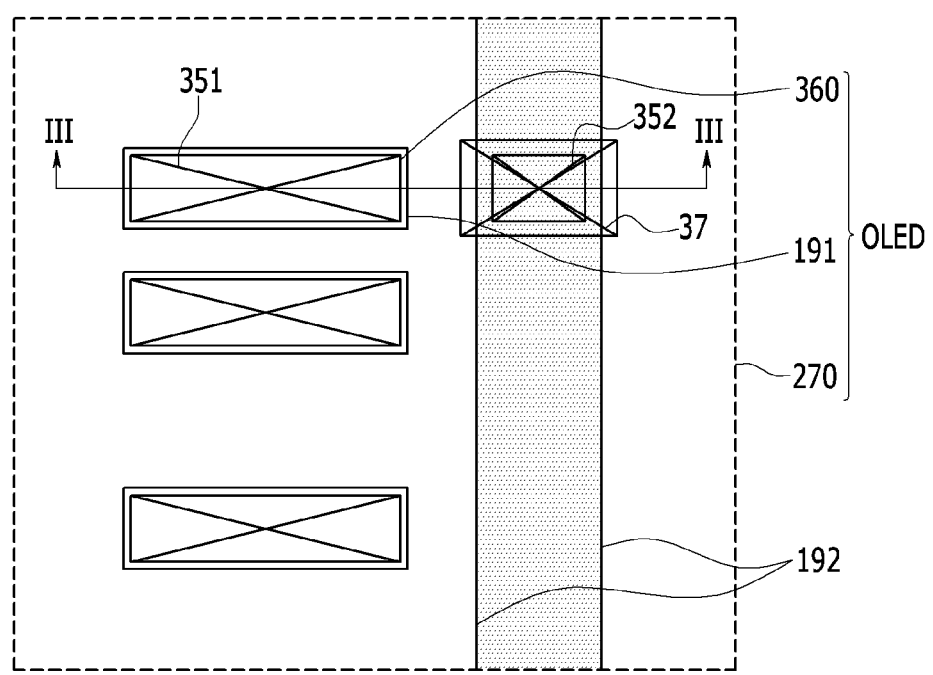
FIG. 2 is a partial layout view of an organic light emitting diode display according to an exemplary embodiment of the present disclosure.
Figure 3:
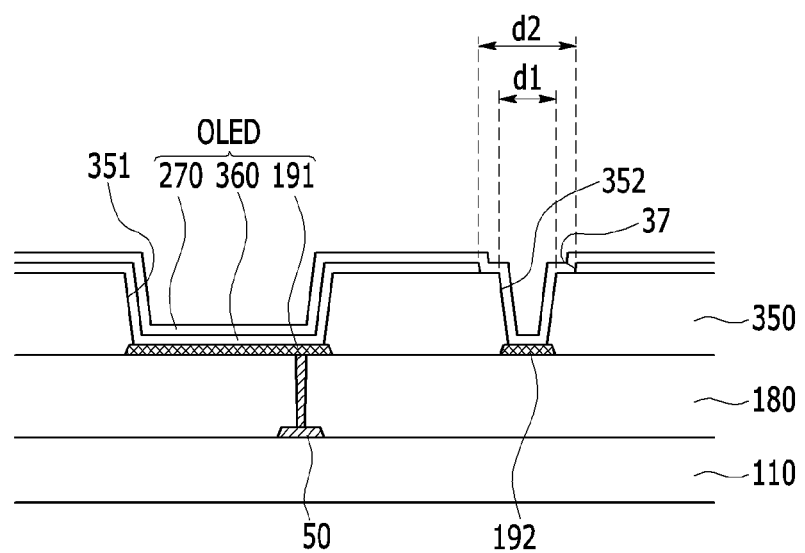
FIG. 3 is a cross-sectional view taken along a line of FIG. 2.

FIG. 2 is a partial layout view of an organic light emitting diode display according to an exemplary embodiment of the present disclosure, and FIG. 3 is a cross-sectional view taken along a line of FIG. 2.

As shown in FIG. 2 and FIG. 3, the organic light emitting diode display according to an exemplary embodiment of the present disclosure includes a transistor 50 including the switching transistor T1 and the driving transistor T2 on a substrate 110. The transistor 50 is covered by an insulating layer 180.

A first electrode 191 and an auxiliary electrode 192 are disposed to be separated from each other on the insulating layer 180. The first electrode 191 is connected to the transistor 50.

The first electrode 191 and the auxiliary electrode 192 are formed of the same material, and the first electrode 191 and the auxiliary electrode 192 are disposed at the same layer. In the organic light emitting diode display of a top emission structure, the first electrode 191 and the auxiliary electrode 192 may be made of a conductor having high reflectance and high conductivity.

A pixel defining layer 350 covering the first electrode 191 and the auxiliary electrode 192 is disposed on the insulating layer 180. The pixel defining layer 350 includes a pixel opening 351 overlapping the most of the first electrode 191 and a first contact hole 352 overlapping a part of the auxiliary electrode 192. The pixel defining layer 350 may be made of an organic material such as a polyacrylate resin, a polyimide resin, or a silica-based inorganic material.

An organic light emitting member is disposed on the pixel defining layer 350 and the first electrode 191. The organic light emitting member includes an organic emission layer 360. At least a portion of the organic emission layer 360 is disposed on the pixel defining layer 350. A second contact hole 37 is disposed in at least a portion of the organic emission layer 360 disposed on the pixel defining layer 350. When being viewed in a direction perpendicular to the substrate 110, the second contact hole 37 overlaps the auxiliary electrode 192, and a side wall of the second contact hole 37 encloses the first contact hole 352. That is, a width d2 of the second contact hole 37 is larger than a width d1 of the first contact hole 352.

A method of forming the second contact hole 37 in the organic emission layer 360 without using a laser drilling process will be described later in detail in a manufacturing method of the organic light emitting diode display according to an exemplary embodiment of the present disclosure.

The organic emission layer 360 may be made of a low-molecular organic material or a high-molecular organic material such as poly(3,4-ethylenedioxythiophene) (PEDOT). The organic emission layer 360 may be formed of a multilayer including an emission layer and one or more selected among an emission layer, a hole-injection layer (HIL), a hole-transporting layer (HTL), an electron-transporting layer (ETL), and an electron-injection layer (EIL). When the organic emission layer 360 includes all of them, the hole-injection layer is disposed on the pixel electrode 191 as the anode, and the hole-transporting layer, the emission layer, the electron-transporting layer, and the electron-injection layer may be sequentially laminated thereon. The organic emission layer 360 may be at least one among a red organic emission layer emitting red light, a blue organic emission layer emitting blue light, and a green organic emission layer emitting green light, and the red organic emission layer, the blue organic emission layer, and the green organic emission layer are respectively formed in a red pixel, a green pixel, and a blue pixel, thereby realizing a color image.

A second electrode 270 is disposed on the organic emission layer 360 and in the first contact hole 352 and the second contact hole 37. In the organic light emitting diode display of the top emission structure, the second electrode 270 may be formed of the transparent conductor such as ITO (Indium Tin Oxide) or IZO (Indium Zinc Oxide). The second electrode 270 is in contact with the auxiliary electrode 192 through the first contact hole 352 and the second contact hole 37.

When the organic light emitting diode display is large such that the second electrode 270 is large, the second electrode 270 formed of ITO (Indium Tin Oxide) or IZO (Indium Zinc Oxide) having low conductivity may easily cause a voltage drop. However, like an exemplary embodiment of the present disclosure, as the auxiliary electrode 192 made of the metal having high conductivity is connected to the second electrode 270, the resistance may be minimized such that the voltage drop of the second electrode 270 may be minimized.

The first electrode 191, the organic emission layer 360, and the second electrode 270 together form the organic light emitting diode OLED. Herein, the first electrode 191 becomes an anode as the hole injection electrode, and the second electrode 270 becomes a cathode as the electron injection electrode. However, the present exemplary embodiment is not necessarily limited thereto, and depending on a driving method of the organic light emitting diode display device, the first electrode 191 may become the cathode while the second electrode 270 may become the anode.

An encapsulation member (not illustrated) protecting the organic light emitting diode OLED may be formed on the second electrode 270, and the encapsulation member may be encapsulated on the substrate 110 by a sealant, and may be made of various materials such as glass, quartz, ceramic, plastic, and metal. Meanwhile, a thin film encapsulation layer may be formed by depositing an inorganic layer and an organic layer on the second electrode 270 without using a sealant.

The manufacturing method of the organic light emitting diode display according to an exemplary embodiment of the present disclosure will be described in detail with reference to FIG. 4, FIG. 5, and FIG. 6.

Figure 4:
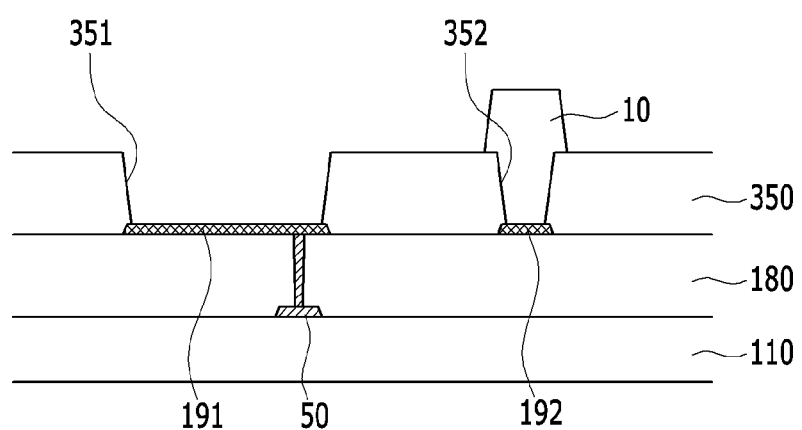
FIG. 4 is a cross-sectional view showing one step of a manufacturing method of an organic light emitting diode display according to an exemplary embodiment of the present disclosure.
Figure 5:
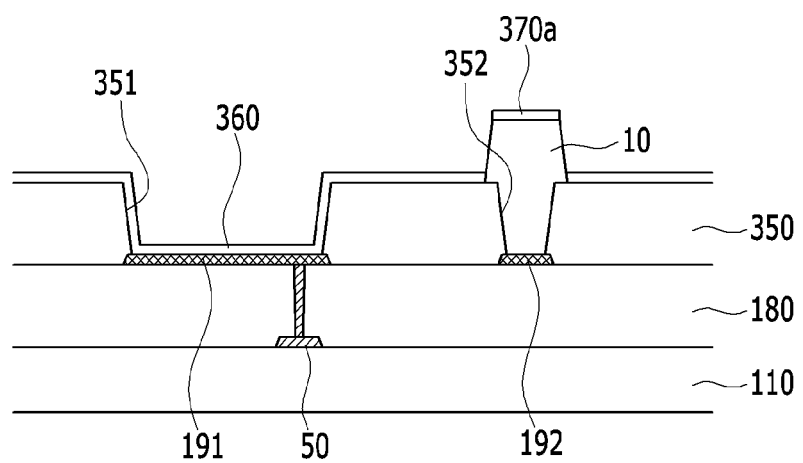
FIG. 5 is a cross-sectional view of a step subsequent that of FIG. 4.
Figure 6:
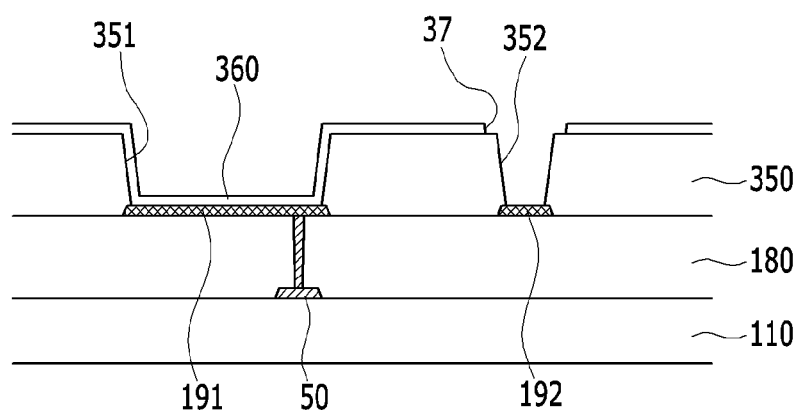
FIG. 6 is a cross-sectional view of a step subsequent to that of FIG. 5.

FIG. 4 is a cross-sectional view showing one step of a manufacturing method of an organic light emitting diode display according to an exemplary embodiment of the present disclosure, FIG. 5 is a cross-sectional view of a step subsequent to that of FIG. 4, and FIG. 6 is a cross-sectional view of a step subsequent to that of FIG. 5.

First, as shown in FIG. 4, the transistor 50 is formed on the substrate 110 and the transistor 50 is covered by the insulating layer 180. Next, the first electrode 191 and the auxiliary electrode 192 are formed to be separated from each other on the insulating layer 180.

The pixel defining layer 350 covering the first electrode 191 and the auxiliary electrode 192 is formed on the insulating layer 180. The pixel opening 351 overlapping most of the first electrode 191 and the first contact hole 352 overlapping part of the auxiliary electrode 192 are formed in the pixel defining layer 350. A first photosensitive film 10 overlapping the first contact hole 352 is formed on the pixel defining layer 350. The first photosensitive film 10 may cover the first contact hole 352.

Next, as shown in FIG. 5, the organic emission layer 360 and the organic emission layer 370a are formed on the whole surface. The organic emission layer 360 is formed on the first electrode 191 overlapping the pixel opening 351, the pixel defining layer 350, and the first photosensitive film 10. Since an upper surface of the first photosensitive film 10 is disposed higher than the upper surface of the pixel defining layer 350, an organic emission layer 370a formed on the first photosensitive film 10 is physically separated from the organic emission layer 360 formed on the pixel defining layer 350 by a step between the surface of the first photosensitive film 10 and the surface of the pixel defining layer 350.

As shown in FIG. 6, the first photosensitive film 10 is removed. In this case, the organic emission layer 370a disposed on the first photosensitive film 10 is removed together therewith. Accordingly, the second contact hole 37 is formed at the position corresponding to the first photosensitive film 10 in the organic emission layer 370a.

Next, as shown in FIG. 3, the second electrode 270 is formed on the organic emission layer 360 and inside the first contact hole 352 and the second contact hole 37. The second electrode 270 is in contact with the auxiliary electrode 192 through the first contact hole 352 and the second contact hole 37.

As described above, even if the laser drilling process for removing the organic emission layer on the auxiliary electrode by using a laser to contact the auxiliary electrode and the second electrode is not used, the second electrode and the auxiliary electrode may be in electrical contact such that damage to the pixel by the laser is not generated. Also, since the laser drilling process is not performed, particles are not generated such that a dark point or a bright point may be minimized, thereby improving a yield. Also, to electrically contact the second electrode and the auxiliary electrode, since the laser drilling process is not applied, but the photolithography process may be used, separate laser drilling equipment is not needed such that the manufacturing cost may be reduced. Further, when the laser drilling process forms the plurality of openings in the organic light emitting member to contact the second electrode and the auxiliary electrode, a manufacturing time is increased, however the manufacturing time may be maintained to be equal to the conventional art even though the plurality of openings are formed according to an exemplary embodiment of the present disclosure.

On the other hand, in the exemplary embodiment, the organic light emitting member only includes the organic emission layer, however the organic light emitting member may include a first organic emission layer, a middle layer, and a second organic emission layer to improve emission efficiency as another exemplary embodiment.

Next, the organic light emitting diode display according to another exemplary embodiment of the present disclosure will be described with reference to FIG. 7.

Figure 7:
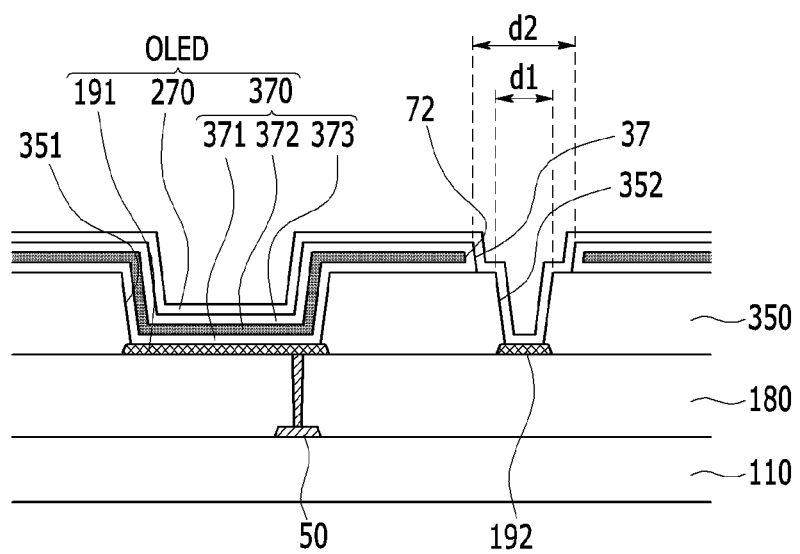
FIG. 7 is a cross-sectional view of an organic light emitting diode display according to another exemplary embodiment of the present disclosure.

FIG. 7 is a cross-sectional view of an organic light emitting diode display according to another exemplary embodiment of the present disclosure.

The exemplary embodiment shown in FIG. 7 is substantially the same as the exemplary embodiment shown in FIG. 2 and FIG. 3 except for the structure of the organic light emitting member such that the repeated description is omitted.

As shown in FIG. 7, in the organic light emitting diode display according to another exemplary embodiment of the present disclosure, the pixel defining layer 350 covering the first electrode 191 and the auxiliary electrode 192 is disposed on the insulating layer 180. The pixel defining layer 350 includes the pixel opening 351 overlapping most of the first electrode 191 and the first contact hole 352 overlapping the part of the auxiliary electrode 192.

The organic light emitting member 370 is disposed on the pixel defining layer 350 and the first electrode 191. The organic light emitting member 370 includes a first organic emission layer 371, a middle layer 372 disposed on the first organic emission layer 371, and a second organic emission layer 373 disposed on the middle layer 372. The first organic emission layer 371 and the second organic emission layer 373 may be made of the same material. The middle layer 372 may include a metal oxide to facilitate charge generation. The middle layer 372 may include a tungsten oxide (WOx), a molybdenum oxide (MoOx), C60, or a HATCN-based metal oxide.

Accordingly, the organic light emitting member 370 including the middle layer 372 improves emission efficiency.

The organic light emitting member 370 has the second contact hole 37 at the position overlapping the auxiliary electrode 192. The edge of the second contact hole 37 encloses the edge of the first contact hole 352. In this case, the second organic emission layer 373 covers a side wall 72 of the middle layer 372. Accordingly, the middle layer 372 is not exposed to the side wall of the second contact hole 37, so that the middle layer 372 will not short-circuit with the second electrode 270.

The manufacturing method of the organic light emitting diode display according to another exemplary embodiment of the present disclosure will be described with reference to FIG. 8, FIG. 9, FIG. 10, and FIG. 11.

Figure 8:
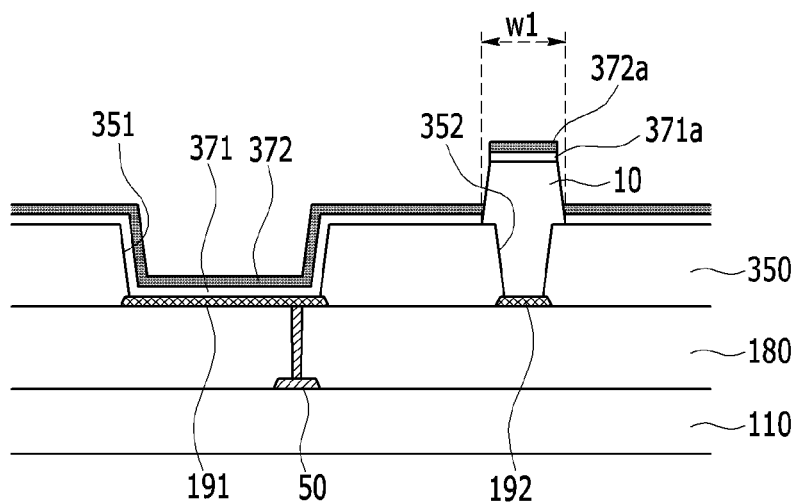
FIG. 8 is a cross-sectional view showing one step of a manufacturing method of an organic light emitting diode display according to another exemplary embodiment of the present disclosure.
Figure 9:
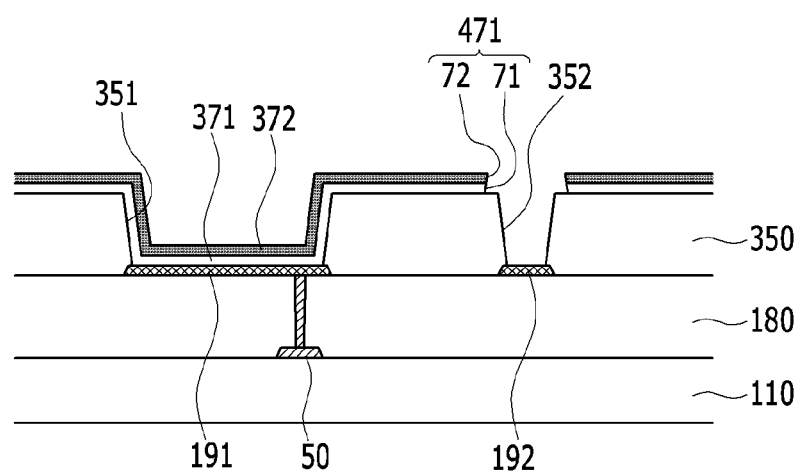
FIG. 9 is a cross-sectional view of a step subsequent to that of FIG. 8.
Figure 10:
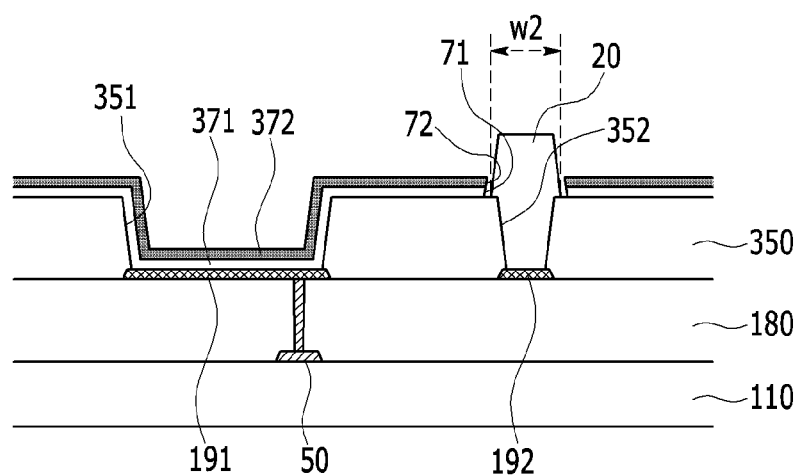
FIG. 10 is a cross-sectional view of a step subsequent to that of FIG. 9.
Figure 11:
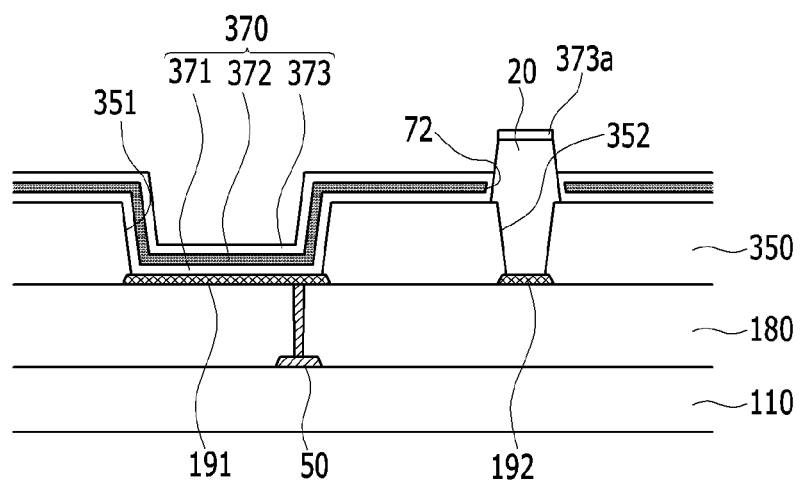
FIG. 11 is a cross-sectional view of a step subsequent to that of FIG. 10.

FIG. 8 is a cross-sectional view showing one step of a manufacturing method of an organic light emitting diode display according to another exemplary embodiment of the present disclosure, FIG. 9 is a cross-sectional view of a step subsequent to that of FIG. 8, FIG. 10 is a cross-sectional view of a step subsequent to that of FIG. 9, and FIG. 11 is a cross-sectional view of a step subsequent to that of FIG. 10.

Firstly, as shown in FIG. 8, the transistor 50 is formed on the substrate 110, and the transistor 50 is covered by the insulating layer 180. The first electrode 191 and the auxiliary electrode 192 are formed to be separated from each other on the insulating layer 180. The pixel defining layer 350 covering the first electrode 191 and the auxiliary electrode 192 is formed on the insulating layer 180. The pixel opening 351 overlapping most of the first electrode 191 and the first contact hole 352 overlapping part of the auxiliary electrode 192 are formed in the pixel defining layer 350. The first photosensitive film 10 overlapping the first contact hole 352 is formed on the pixel defining layer 350. The first photosensitive film 10 may cover the first contact hole 352. The first organic emission layer 371 is formed on the first electrode 191, the pixel defining layer 350, and the first photosensitive film 10. The first organic emission layer 371 is formed on the first electrode 191 overlapping the pixel opening 351, the pixel defining layer 350, and the first photosensitive film 10. Since the upper surface of the first photosensitive film 10 is disposed higher than the upper surface of the pixel defining layer 350, a first organic emission layer 371a formed on the first photosensitive film 10 is physically separated from the first organic emission layer 371 formed on the pixel defining layer 350 by the step between the surface of the first photosensitive film 10 and the surface of the pixel defining layer 350.

A middle layer 372 and the middle layer 372a are formed on the first organic emission layer 371. Since the upper surface of the first photosensitive film 10 is disposed higher than the upper surface of the pixel defining layer 350, by the step between the surface of the first photosensitive film 10 and the surface of the pixel defining layer 350, the middle layer 372a formed at the position corresponding to the first photosensitive film 10 is physically separated from the middle layer 372 formed at the position corresponding to the pixel defining layer 350.

Next, as shown in FIG. 9, the first photosensitive film 10 is removed. In this case, the first organic emission layer 371a and the middle layer 372a disposed on the first photosensitive film 10 are removed together. Accordingly, the first contact hole 352 is exposed to the outside. In this case, in the first organic emission layer 371 and the middle layer 372, temporary contact holes 471 is formed at the position corresponding to the first photosensitive film 10. The temporary contact holes 471 include a side wall 71 of the first organic emission layer 371 and a side wall 72 of the middle layer 372 on the position corresponding to the pixel defining layer 350.

Next, as shown in FIG. 10, a second photosensitive film 20 is formed inside the temporary contact holes 471. In this case, since the width w2 of the second photosensitive film is smaller than the width w1 of the first photosensitive film, the side wall 71 of the first organic emission layer 371 and the side wall 72 of the middle layer 372 are separated from the second photosensitive film 20.

Next, as shown in FIG. 11, the second organic emission layer 373 and the second organic emission layer 373a are formed on the middle layer 372 and the second photosensitive film 20. In this case, by the step between the surface of the second photosensitive film 20 and the surface of the pixel defining layer 350, the second organic emission layer 373a formed at the position corresponding to the second photosensitive film 20 is physically separated from the second organic emission layer 373 formed at the position corresponding to the pixel defining layer 350. Also, the second organic emission layer 373 covers the side wall 71 of the first organic emission layer 371 and the side wall 72 of the middle layer 372.

Next, as shown in FIG. 7, the second photosensitive film 20 is removed. In this case, the second organic emission layer 373a disposed on the second photosensitive film 20 is removed together therewith. Accordingly, in the organic light emitting member 370, the second contact hole 37 is formed at the position corresponding to the second photosensitive film 20. Also, the second electrode 270 is formed on the organic light emitting member 370 and inside the first contact hole 352 and the second contact hole 37. The second electrode 270 is in contact with the auxiliary electrode 192 through the first contact hole 352 and the second contact hole 37. In this case, since the second organic emission layer 373 of the organic light emitting member 370 covers the side wall 72 of the middle layer 372, the second electrode 270 is not short-circuited with the middle layer 372.

As described above, by forming the second contact hole 37 by using the first photosensitive film 10 and the second photosensitive film 20, even if the organic light emitting member 370 including the middle layer 372 is formed, the auxiliary electrode 192 and the second electrode 270 may be in contact through the first contact hole 352 and the second contact hole 37 such that the voltage drop of the second electrode may be minimized.

Next, as shown in FIG. 3, the second electrode 270 is formed on the organic emission layer 360 and inside of the first contact hole 352 and the second contact hole 37. The second electrode 270 is in contact with the auxiliary electrode 192 through the first contact hole 352 and the second contact hole 37.

On the other hand, in another exemplary embodiment, the organic light emitting member includes the first organic emission layer, the middle layer, and the second organic emission layer, however the organic light emitting member may include a plurality of first organic emission layers and a plurality of middle layers that are alternately deposited and the second organic emission layer that is formed on the highest middle layer as another exemplary embodiment.

Next, the organic light emitting diode display according to another exemplary embodiment will be described in detail with reference to FIG. 12.

Figure 12:
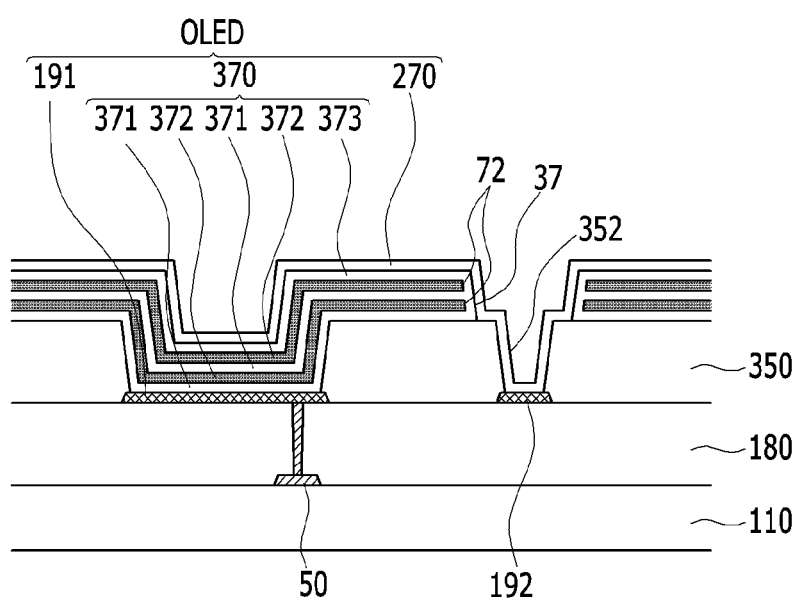
FIG. 12 is a cross-sectional view of an organic light emitting diode display according to another exemplary embodiment of the present disclosure.

FIG. 12 is a cross-sectional view of an organic light emitting diode display according to another exemplary embodiment of the present disclosure.

The exemplary embodiment shown in FIG. 12 is substantially the same as the exemplary embodiment shown in FIG. 7 except for the structure of the organic light emitting member such that the repeated description is omitted.

As shown in FIG. 12, the organic light emitting member of the organic light emitting diode display according to the current exemplary embodiment of the present disclosure may include the first organic emission layer 371, the middle layer 372 disposed on the first organic emission layer 371, the first organic emission layer 371 disposed on the middle layer 372, the middle layer 372 disposed on the first organic emission layer, and the second organic emission layer 373 covering the middle layer 372. As described above, two first organic emission layers 371 and two middle layers 372 are alternately deposited, and the second organic emission layer 373 may be formed on the highest middle layer 372. In this case, the first organic emission layer 371 and the second organic emission layer 373 may be formed of the same material. As described above, by alternately depositing two first organic emission layers 371 and two middle layers 372, the emission efficiency of the organic light emitting member may be further improved. In the present exemplary embodiment, two first organic emission layers 371 and two middle layers 372 are alternately deposited, however it is not limited thereto, and three or more first organic emission layers 371 and three or more middle layers 372 may be alternately deposited as another exemplary embodiment.

The organic light emitting member 370 has the second contact hole 37 at the position overlapping the auxiliary electrode 192. The side wall of the second contact hole 37 encloses the first contact hole 352. In this case, the second organic emission layer 373 covers the side wall 72 of the middle layer 372. Accordingly, the middle layer 372 is not exposed to the side wall of the second contact hole 37 so as to not be short-circuited with the second electrode 270.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

<Description of symbols>

| | |
|---|---|
| 10: first photosensitive film | 20: second photosensitive film |
| 37: second contact hole | 71: side wall of a first organic emission layer |
| 72: side wall of a middle layer | 110: substrate |
| 180: insulating layer | 191: first electrode |
| 192: auxiliary member | 270: second electrode |
| 350: pixel defining layer | 351: pixel opening |
| 352: first contact hole | 370: organic light emitting member |
| 371: first organic emission layer | 372: middle layer |
| 373: second organic emission layer | |

What is claimed is:

1. An organic light emitting diode display comprising:
a substrate;
a first electrode disposed on the substrate;
an auxiliary electrode formed at the same layer as the first electrode;
a pixel defining layer having a first contact hole overlapping a part of the auxiliary electrode;
an organic light emitting member disposed on the pixel defining layer and having a second contact hole enclosing the first contact hole; and
a second electrode disposed on the organic light emitting member and inside the first contact hole and the second contact hole,
wherein the second electrode is in contact with the auxiliary electrode through the first contact hole and the second contact hole,
wherein a width of the second contact hole is larger than a width of the first contact hole in a plan view, and
wherein the organic light emitting member includes:
a first organic emission layer;
a middle layer disposed on the first organic emission layers; and
a second organic emission layer covering the middle layer, and
wherein the second organic emission layer covers a side wall of the middle layer.

2. The organic light emitting diode display of claim 1, wherein
the middle layer includes a metal oxide.

3. The organic light emitting diode display of claim 1, wherein
the first organic emission layer and the second organic emission layer include the same material.

* * * * *